US012688993B2

(12) United States Patent (10) Patent No.: US 12,688,993 B2

Litman et al. (45) Date of Patent: Jul. 21, 2026

(54) MULTIPLE ELECTRON BEAM OPTICS

(71) Applicant: Applied Materials Israel Ltd., Rehovot (IL)

(72) Inventors: Alon Litman, Nes-Ziona (IL); Ron Naftali, Shoham (IL)

(73) Assignee: Applied Materials Israel Ltd., Rehovot (IL)

( * ) Notice: Subject to any disclaimer, the term of this patent is extended or adjusted under 35 U.S.C. 154(b) by 477 days.

(21) Appl. No.: 18/198,194

(22) Filed: May 16, 2023

(65) Prior Publication Data

US 2024/0387140 A1 Nov. 21, 2024

(51) Int. Cl.
H01J 37/147 (2006.01)
H01J 37/244 (2006.01)

(52) U.S. Cl.
CPC ........ H01J 37/1472 (2013.01); H01J 37/244 (2013.01); *H01J 2237/0453* (2013.01); *H01J 2237/0635* (2013.01); *H01J 2237/24475* (2013.01)

(58) Field of Classification Search
CPC ................ H01J 37/1472; H01J 37/244; H01J 2237/0453; H01J 2237/0635; H01J 2237/24475; H01J 2237/2446; H01J 2237/2448; H01J 37/28; H01J 37/026; H01J 37/045; H01J 37/228; G01T 1/29
See application file for complete search history.

(56) References Cited

U.S. PATENT DOCUMENTS

| | | | | |
|---|---|---|---|---|
| 5,466,940 | A | * 11/1995 | Litman | ................. H01J 37/244 |
| | | | | 250/397 |
| 6,750,455 | B2 | 6/2004 | Lo et al. | |
| 7,262,418 | B2 | 8/2007 | Lo et al. | |
| 7,285,779 | B2 | 10/2007 | Litman et al. | |
| 10,777,382 | B2 * | 9/2020 | Li | ........................... H01J 37/28 |

(Continued)

FOREIGN PATENT DOCUMENTS

| | | |
|---|---|---|
| KR | 20230021128 A | 2/2023 |
| TW | 202217899 A | 5/2022 |

(Continued)

OTHER PUBLICATIONS

KR10-2024-0061664, "Office Action", May 22, 2025, 7 pages.

(Continued)

*Primary Examiner* — David A Vanore

(74) *Attorney, Agent, or Firm* — Kilpatrick Townsend & Stockton LLP

(57) ABSTRACT

Multiple electron beam optics that includes a detection unit that comprises an array of sensors, and a cross talk reduction unit. For each sensor of multiple sensors of the array of sensors: (i) the sensor includes an aperture and a sensing region that is configured to sense relevant backscattered electrons, the relevant backscattered electrons are emitted from the sample as a result of an illumination of the sample with a primary electron beam that is associated with the sensor and passed through the aperture; and (ii) the crosstalk reduction unit is configured to at least partially prevent a detection, by the sensor, of cross talk backscattered electrons, the cross talk backscattered electrons are emitted from the sample as result of an illumination of the sample by one or more primary beams not associated with the sensor.

14 Claims, 9 Drawing Sheets

(56) References Cited

U.S. PATENT DOCUMENTS

| | | | |
|---|---|---|---|
| 11,276,554 B2 | 3/2022 | Ohashi et al. | |
| 11,315,753 B2 * | 4/2022 | Tsutsumi | H01J 37/24 |
| 11,366,072 B2 | 6/2022 | Levin et al. | |
| 12,261,016 B1 * | 3/2025 | Yin | H01J 37/28 |
| 2016/0372304 A1 * | 12/2016 | Masnaghetti | G01N 23/203 |
| 2017/0084421 A1 * | 3/2017 | McCord | H01J 37/045 |
| 2018/0254167 A1 | 9/2018 | Zhao et al. | |
| 2018/0358200 A1 | 12/2018 | Haynes et al. | |
| 2022/0351937 A1 * | 11/2022 | Zur | H01J 37/18 |
| 2022/0351938 A1 * | 11/2022 | Nakamura | H01J 37/265 |
| 2024/0387140 A1 * | 11/2024 | Litman | H01J 37/1472 |

FOREIGN PATENT DOCUMENTS

| | | | |
|---|---|---|---|
| WO | 2021205728 A1 | 10/2021 | |
| WO | 2022117285 A1 | 6/2022 | |

OTHER PUBLICATIONS

TW113117711, "Office Action", Mar. 10, 2025, 7 pages.
KR10-2024-0061664, "Office Action", Jan. 13, 2026, 8 pages.
TW113117711, "Office Action", Feb. 5, 2026, 7 pages.

* cited by examiner

21

22

20

20

30

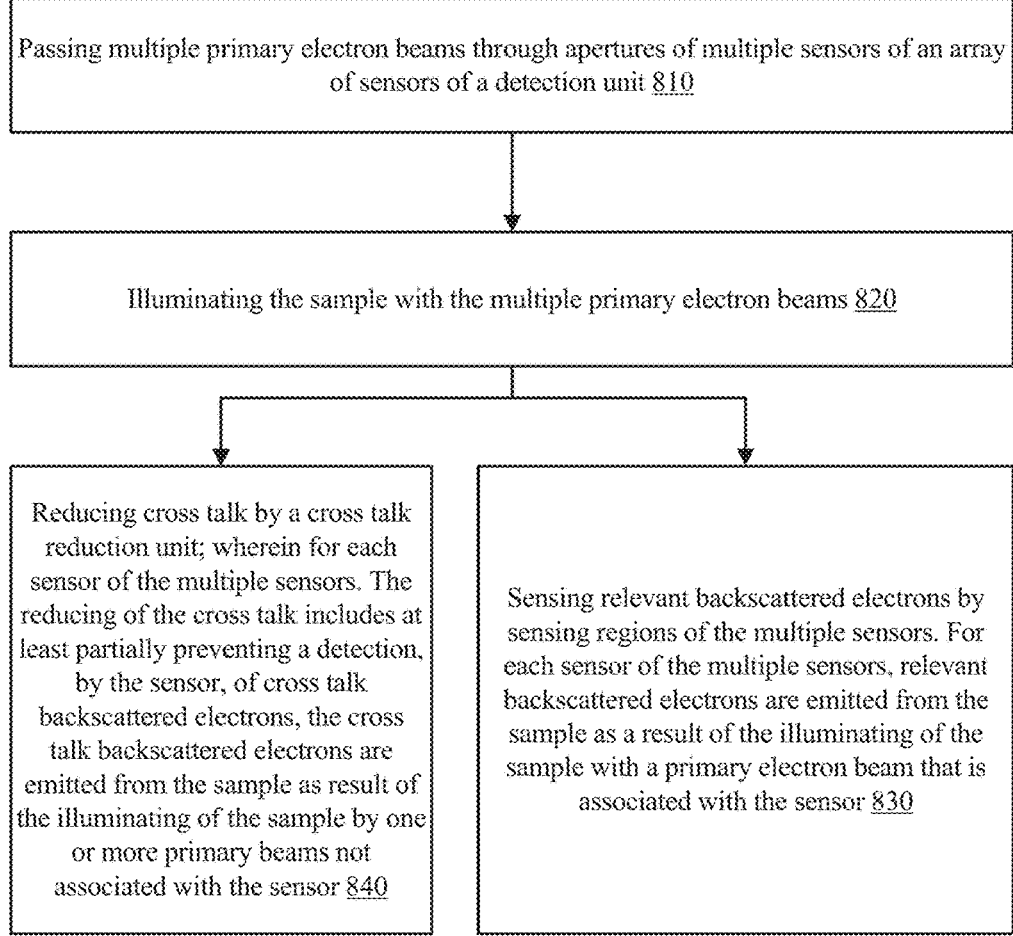

Passing multiple primary electron beams through apertures of multiple sensors of an array of sensors of a detection unit 810

Illuminating the sample with the multiple primary electron beams 820

Reducing cross talk by a cross talk reduction unit; wherein for each sensor of the multiple sensors. The reducing of the cross talk includes at least partially preventing a detection, by the sensor, of cross talk backscattered electrons, the cross talk backscattered electrons are emitted from the sample as result of the illuminating of the sample by one or more primary beams not associated with the sensor 840

Sensing relevant backscattered electrons by sensing regions of the multiple sensors. For each sensor of the multiple sensors, relevant backscattered electrons are emitted from the sample as a result of the illuminating of the sample with a primary electron beam that is associated with the sensor 830

MULTIPLE ELECTRON BEAM OPTICS

BACKGROUND OF THE INVENTION

Various high-throughput electron beam evaluation systems illuminate a sample with multiple electron beams and attempt to detect backscattered electrons emitted from the sample as a result of the illumination.

Some such systems can suffer from cross talk.

There is a growing need to provide a high-throughput solution that will exhibit a low level of cross talk.

BRIEF SUMMARY OF THE INVENTION

There may be provided a method for multiple electron beam evaluation of a sample, the method may include (i) passing multiple primary electron beams through apertures of multiple sensors of an array of sensors of a detection unit; wherein each sensor of the multiple sensors is associated with a primary electron beam of the multiple primary electron beams; (ii) illuminating the sample with the multiple primary electron beams; (iii) sensing relevant backscattered electrons by sensing regions of the multiple sensors; wherein for each sensor of the multiple sensors, relevant backscattered electrons are emitted from the sample as a result of the illuminating of the sample with a primary electron beam that is associated with the sensor; and (iv) reducing cross talk by a cross talk reduction unit; wherein for each sensor of the multiple sensors, the reducing of the cross talk comprises at least partially preventing a detection, by the sensor, of cross talk backscattered electrons, the cross talk backscattered electrons are emitted from the sample as result of the illuminating of the sample by one or more primary beams not associated with the sensor.

There may be provided multiple electron beam optics, that include a detection unit that includes an array of sensors and a cross talk reduction unit. For each sensor of multiple sensors of the array of sensors: (i) the sensor includes an aperture and a sensing region that is configured to sense relevant backscattered electrons, the relevant backscattered electrons are emitted from the sample as a result of an illumination of the sample with a primary electron beam that is associated with the sensor and passed through the aperture; and (ii) the crosstalk reduction unit is configured to at least partially prevent a detection, by the sensor, of cross talk backscattered electrons, the cross talk backscattered electrons are emitted from the sample as result of an illumination of the sample by one or more primary beams not associated with the sensor.

BRIEF DESCRIPTION OF THE DRAWINGS

The subject matter regarded as the one or more embodiments of the application is particularly pointed out and distinctly claimed in the concluding portion of the specification. The one or more embodiments of the application, however, both as to organization and method of operation, together with objects, features, and advantages thereof, may best be understood by reference to the following detailed description when read with the accompanying drawings in which:

FIG. 9 illustrates an example of a method.

DETAILED DESCRIPTION OF THE INVENTION

Figure 1:
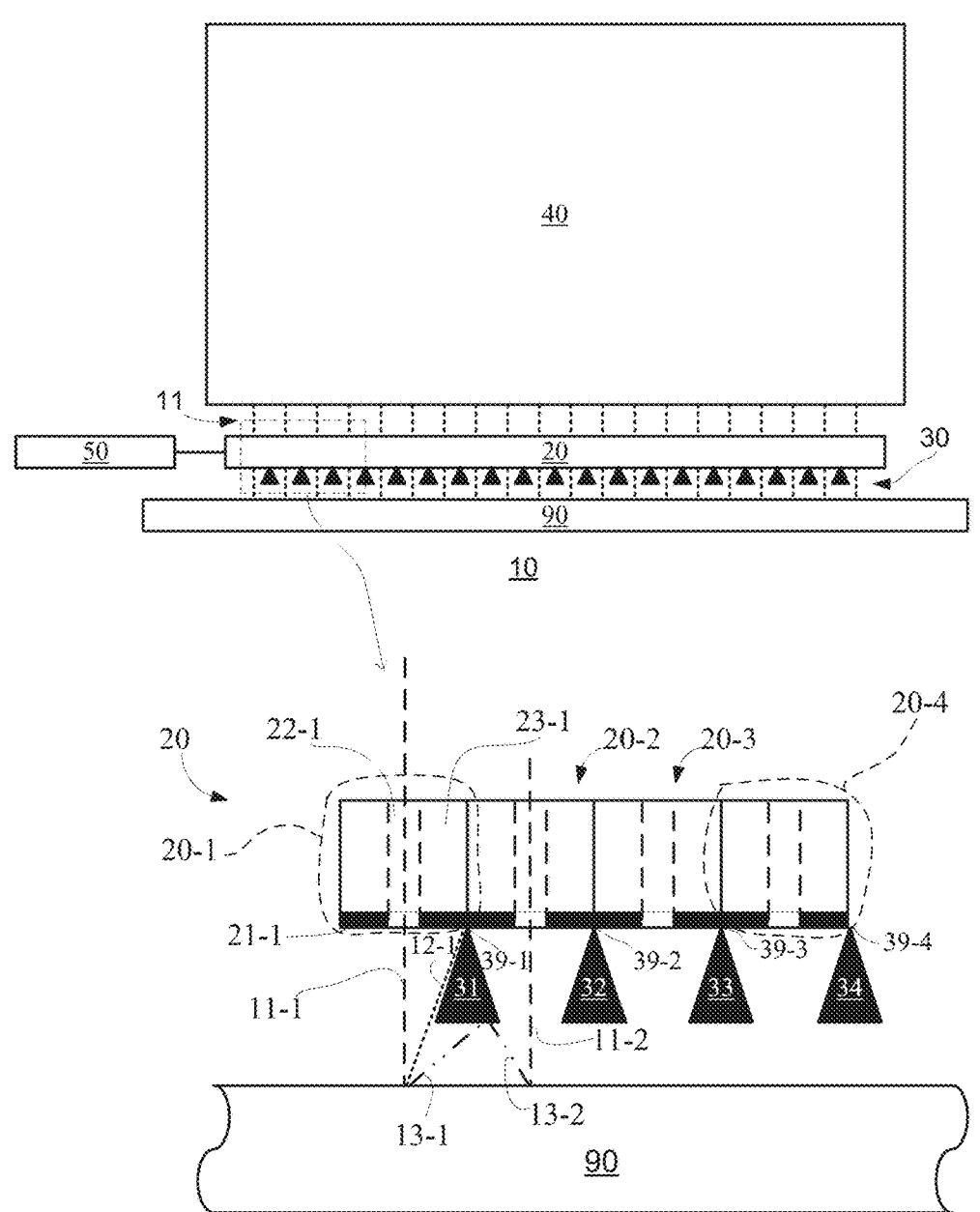
FIG. 1 illustrates an example of a system and a sample.

In the following detailed description, numerous specific details are set forth in order to provide a thorough understanding of the one or more embodiments of the application. However, it will be understood by those skilled in the art that the present one or more embodiments of the application may be practiced without these specific details. In other instances, well-known methods, procedures, and components have not been described in detail so as not to obscure the present one or more embodiments of the application.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the application may for the most part, be implemented using optical components and circuits known to those skilled in the art, details will not be explained in any greater extent than that considered necessary as illustrated above, for the understanding and appreciation of the underlying concepts of the present one or more embodiments of the application and in order not to obfuscate or distract from the teachings of the present one or more embodiments of the application.

Any reference in the specification to a method should be applied mutatis mutandis to a system capable of executing the method.

Any reference in the specification to a system should be applied mutatis mutandis to a method that can be executed by the system.

A processing circuit may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

The following terms have the following meanings:
a. Primary beam associated with a sensor—a primary beam that passes through an aperture of the sensor and then impinges on a sample to generate relevant backscattered electron beams to be detected by the sensor.
b. Cross talk backscattered electrons—in relation to a sensor of an array of sensors—are backscattered electrons emitted from the sample as result of an illumination of the sample by one or more primary beams not associated with the sensor.

FIG. 1 is an example of a system 10 for multiple electron beam evaluation of a sample.

System 10 includes multiple electron beam provider 40, and multiple electron beam optics.

The multiple electron beam optics include cross talk reduction unit that is a spatial filter 30, and detection unit 20.

The detection unit 20 may not belong to an objective lens of the multiple electron beam provider 40. This allows to reduce the size of apertures of sensors of the detection unit—to increase collection efficiency. In order to provide a high collection efficiency of relevant backscattered electrons, the detection unit is proximate to the sample. Proximate means below 2, millimeters, below 1 millimeter, below 0.5 millimeter, or below 0.1 millimeter.

In FIG. 1, system 10 is also illustrated as including processing circuit 50 for processing detection signals generated by the detection unit 20. The detection signals generated by the sensors may be outputted from the detection unit in any manner, for example, by using traces or other conductive paths that are in electrical communications with the sensors of the detection unit.

The multiple electron beam provider 40 is configured to generate multiple primary beams. The multiple primary beams may form a two-dimensional (2D) array of electron beams, a 1D array of electron beams, and the like.

Each primary beam is associated with a sensor of multiple sensors of the array of sensors.

The multiple sensors of the array of sensors may include two or more sensors of the array of sensors, all sensors of the array of sensors or only some sensors of the array of sensors.

The cross talk reduction aims to prevent, at least in part, from cross talk backscattered electrons to be detected by a sensor.

A sensor may include an aperture and a sensing region that is configured to sense relevant backscattered electrons.

The crosstalk reduction unit 30 is configured to at least partially prevent a detection, by a sensor, of cross talk backscattered electrons.

In FIG. 1, the crosstalk reduction unit 30 is a spatial filter—especially a spatial filter having segments that have a triangular cross section, wherein the base of the triangle are closer to the sample, and is regarded as a distal end of the triangle.

The segments may have any shape. The number of sensors, the number of segments, the location of the apertures, the shape of the apertures, the shape of the sensors, the number of sensing regions per sensor, the shape of the sensing regions, may differ from those illustrated in the drawings.

A sensor may be of various shapes and sizes. For example—the area of a sensor may range between 0.1 square millimeters and 10 square millimeters (for example between 0.316 millimeters by 0.316 millimeters to 3.16 millimeters by 3.16 millimeters). An aperture of a sensor may have a diameter that may range between 50 to 200 microns. The height of the cross talk reduction unit may be smaller than 2 millimeters, may be smaller than 1 millimeters, may be smaller than 0.9 millimeters, or may be smaller than 0.5 millimeters.

The bottom of FIG. 1 illustrates a part of the sensing unit and a part of the spatial filter-such as first sensor 20-1, second sensor 20-2, third sensor 20-3, fourth sensor 20-4, first segment 31 of spatial filter 30, second segment 32 of spatial filter 30, third segment 33 of spatial filter 30, and fourth segment 34 of spatial filter 30.

The top of each one of the first till fourth segments of the spatial filter are located at inter-sensor borders such as first inter-sensor border 39-1, second inter-sensor border 39-2, third inter-sensor border 39-3 and fourth inter-sensor border 39-4.

A first primary beam 11-1 passes through an aperture 22-1 of first sensor 20-1, impinges on sample 90 and provides relevant backscattered electrons 12-1 directed towards sensing region 21-1 of first detector. Aperture 22-1 of first sensor 20-1 is formed in body 23-1 of the first sensor 20-1.

Other backscattered electrons 13-1 that are directed towards second sensor 20-2 (and could be regarded as cross talk backscattered electrons of second sensor 20-2) are blocked by first segment 31 of the spatial filter.

A second primary beam 11-2 passes through an aperture of second sensor 20-2, impinges on sample 90 and provides backscattered electrons 13-2 directed towards the first sensor 20-1. First segment 31 of the spatial filter blocks the backscattered electrons 13-2 that can be regarded as a cross talk backscattered electrons of the first sensor 20-1.

Figure 2:
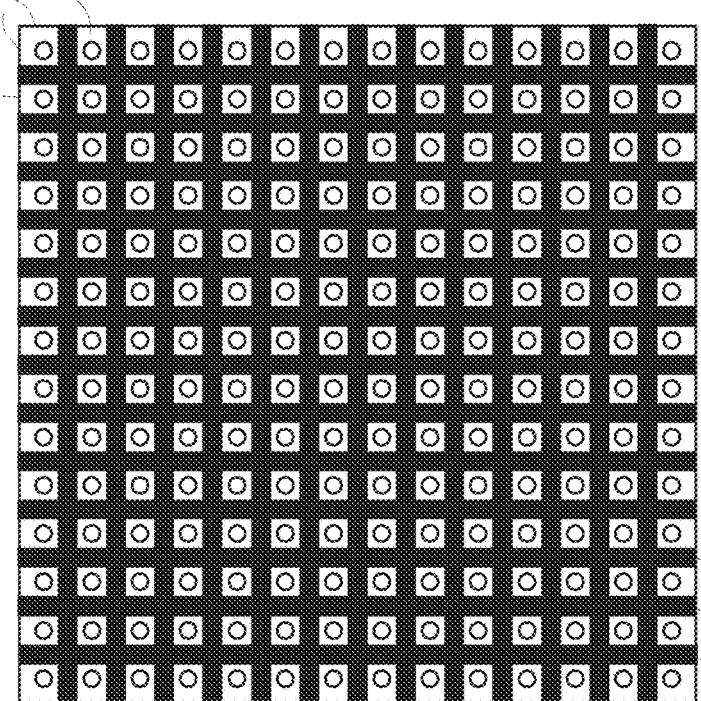
FIG. 2 illustrates an example of a sensing unit and of a spatial filter.

FIG. 2 is a bottom view of an example of detection unit 20 illustrating a 2-D array of sensors that have apertures 22 and sensing regions 21 that surround the apertures. The bottom part of FIG. 2 illustrates a bottom view of a detection unit and a spatial filter 30 having segments positioned at inter-sensor borders.

Figure 3:
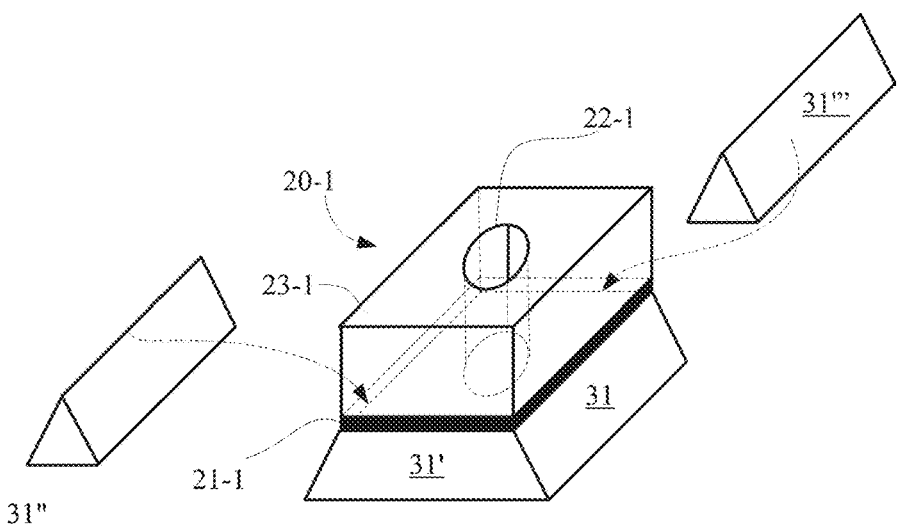
FIG. 3 illustrates an example of a sensor of a sensing unit and of segments of the spatial filter.
Figure 3:
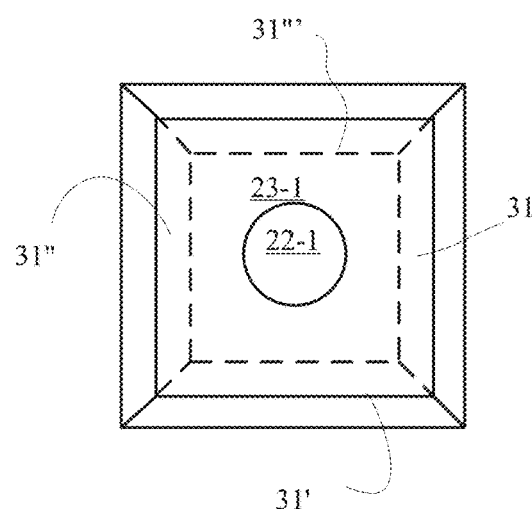

FIG. 3 illustrates an example of a first sensor 20-1 of the sensing unit and of segments 30-1, 30-2, 30-3 and 20-4 of the spatial filter. Sensor 20-1 is illustrated as including aperture 22-1 that is formed in body 23-1, the body 23-1 is located above the sensing region 21-1 of first sensor 20-1. The sensing region 21-1 has a front facet, a left facet, a rear facet and a right facet. A top of first segment 31 of the spatial filter segment is connected to the right facet, a top of additional first segment 31' of the spatial filter is connected to the front facet, a top of another first segment 31" of the spatial filter is connected to the left facet, and a top of a further first segment 31'" of the spatial filter is connected to the rear facet.

Figure 4:
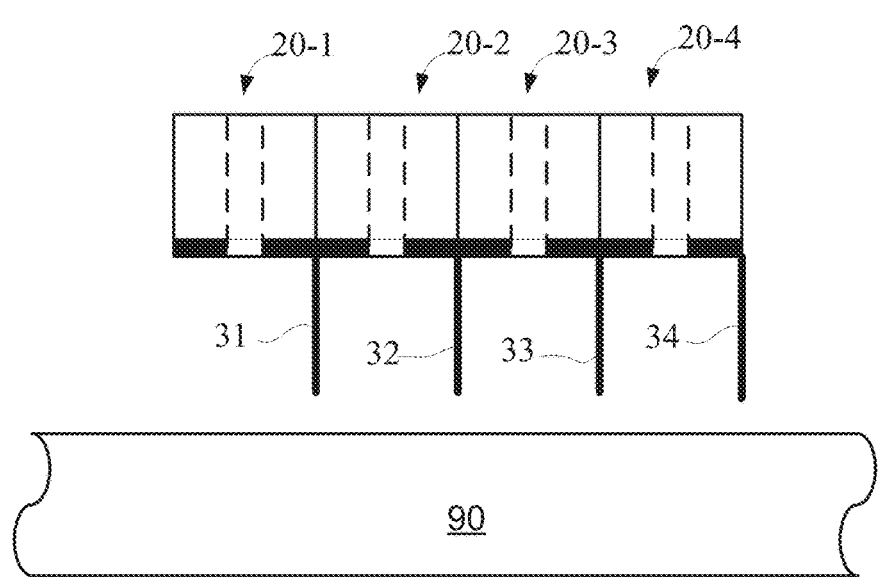
FIG. 4 illustrates an example of a sensors, segments of a spatial filter and a part of a sample.

FIG. 4 illustrates an example of first sensor 20-1, second sensor 20-2, third sensor 20-3, fourth sensor 20-4, first segment 31 of spatial filter 30, second segment 32 of spatial filter 30, third segment 33 of spatial filter 30, and fourth t segment 34 of spatial filter 30. The top of each segment of the first till fourth segments of the spatial filter is located at inter-sensor borders. The first till fourth segments have a rectangular cross section.

Figure 5:
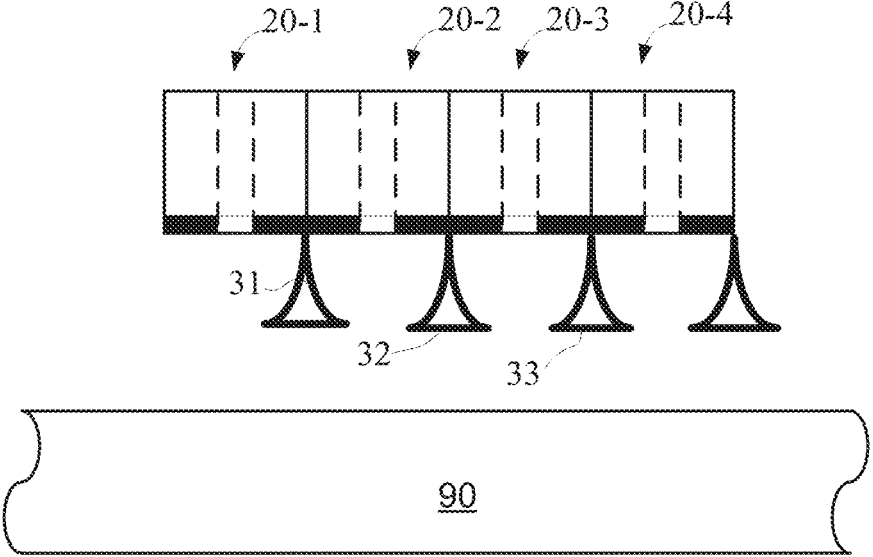
FIG. 5 illustrates an example of a sensors, segments of a spatial filter and a part of a sample.

FIG. 5 illustrates an example of first sensor 20-1, second sensor 20-2, third sensor 20-3, fourth sensor 20-4, first segment 31 of spatial filter 30, second segment 32 of spatial filter 30, third segment 33 of spatial filter 30, and fourth segment 34 of spatial filter 30. The top of each one of the first till fourth segments of the spatial filter is located at inter-sensor borders. The first till fourth segments have a non-linear cross section.

Figure 6:
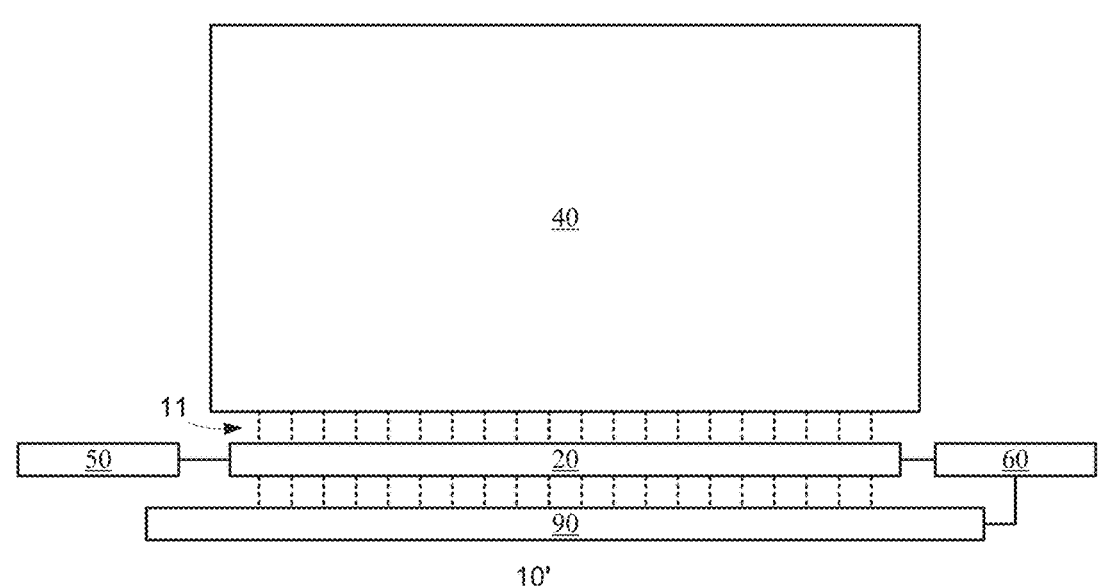
FIG. 6 illustrates an example of a system and a sample.

FIG. 6 is an example of a system 10' for multiple electron beam evaluation of a sample.

System 10' includes multiple electron beam provider 40, and multiple electron beam optics.

The multiple electron beam optics include a cross talk reduction unit that is a biasing unit 60, and detection unit 20.

In FIG. 6, system 10' is also illustrated as including processing circuit 50 for processing detection signals generated by the detection unit 20.

The biasing unit 60 may be configured to perform at least one out of (i) applying one or more repelling electric fields to repel cross talk backscattered electrons from the sensor, or (ii) applying one or more attracting electric fields to attract relevant backscattered electrons to the sensor.

Figure 7:
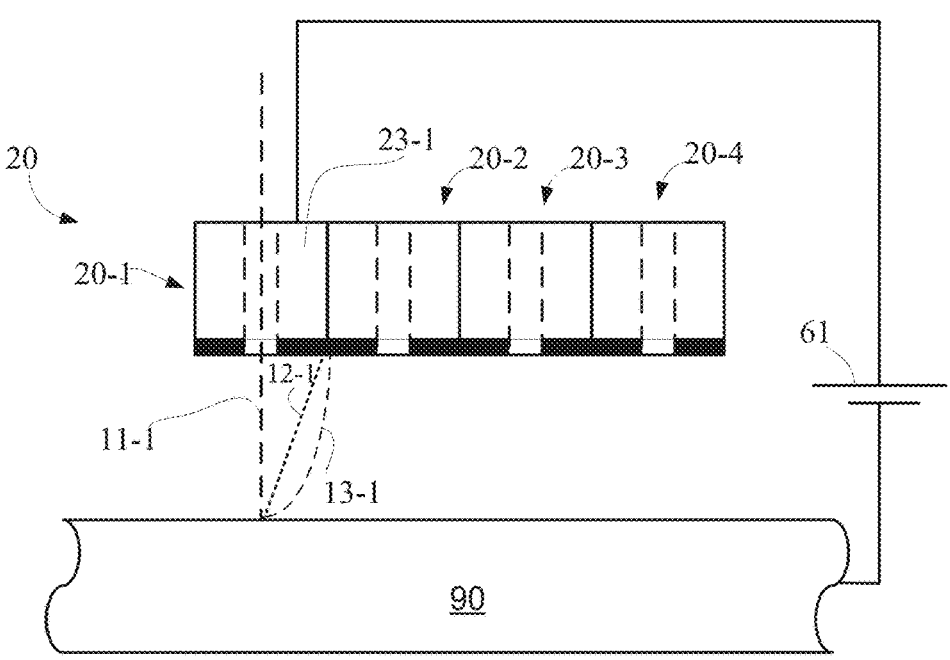
FIG. 7 illustrates an example of a sensors, segments of a spatial filter and a part of a sample.

FIG. 7 illustrates an example of first sensor 20-1, second sensor 20-2, third sensor 20-3, fourth sensor 20-4, and biasing unit 61 that provides an attracting electric field to attract relevant backscattered electrons to the associated sensors—for example attract relevant 12-1 backscattered electrons to the first sensor 20-1. For simplicity of explanation primary electron beams other that first primary electron beam 11-1 were not shown.

According to one or more embodiments, a voltage difference is maintained between (i) the detection unit and (ii) at least one of the wafer and the multiple electron beam provider.

The voltage difference may be maintained by grounding the detection unit and biasing the at least one of the wafer and the multiple electron beam provider.

The voltage difference may be maintained by biasing the detection unit and grounding the at least one of the wafer and the multiple electron beam provider.

The voltage difference may be maintained by biasing the detection unit and by biasing the at least one of the wafer and the multiple electron beam provider.

The detection unit can be maintained at a higher voltage than the at least one of the wafer and the multiple electron beam provider. The detection unit can be maintained at a lower voltage than the at least one of the wafer and the multiple electron beam provider.

According to one or more embodiments, all detectors of the detection unit are maintained at the same voltage level. According to one or more embodiments—one or more sensors of the detection unit are maintained at a different voltage level than one or more other sensors of the detection unit.

Figure 8:
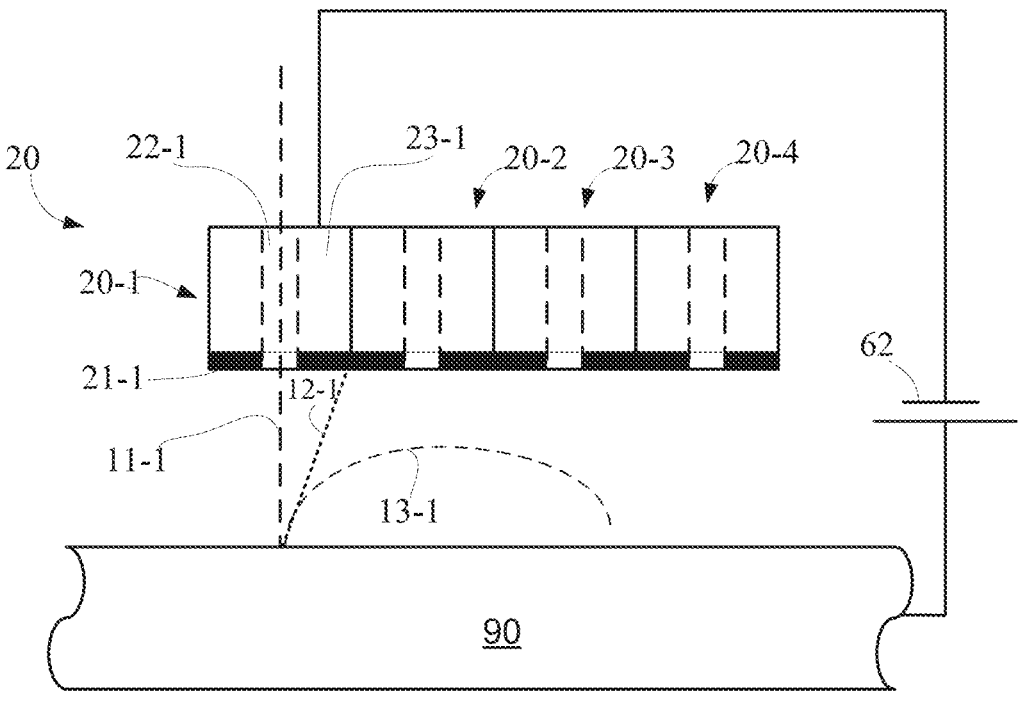
FIG. 8 illustrates an example of a sensors, segments of a spatial filter and a part of a sample.

FIG. 8 illustrates an example of first sensor 20-1, second sensor 20-2, third sensor 20-3, fourth sensor 20-4, and biasing unit 62 that provides a repelling electric field to repel cross talk backscattered electrons from reaching unassociated sensors—for example repel any cross talk backscattered electron from reaching the first sensor 20-1. For simplicity of explanation primary electron beams other that first primary electron beam 11-1 were not shown.

FIG. 9 illustrates an example of a method 800 for multiple electron beam evaluation of a sample.

Method 800 may include step 810 of passing multiple primary electron beams through apertures of multiple sensors of an array of sensors of a detection unit.

Each sensor of the multiple sensors is associated with a primary electron beam of the multiple primary electron beams, the primary electron beam that passes through the aperture of the sensor.

Step 810 is followed by step 820 of illuminating the sample with the multiple primary electron beams.

Step 820 may be followed by steps 830 and 840.

Step 830 includes sensing relevant backscattered electrons by sensing regions of the multiple sensors. For each sensor of the multiple sensors, relevant backscattered electrons are emitted from the sample as a result of the illuminating of the sample with a primary electron beam that is associated with the sensor.

Step 840 includes reducing cross talk by a cross talk reduction unit; wherein for each sensor of the multiple sensors. The reducing of the cross talk includes at least partially preventing a detection, by the sensor, of cross talk backscattered electrons, the cross talk backscattered electrons are emitted from the sample as result of the illuminating of the sample by one or more primary beams not associated with the sensor.

The crosstalk reduction unit may include a spatial filter.

The spatial filter may include multiple segments.

A segment of the multiple segments may include a proximal end that is positioned at one or more inter-sensor borders and a distal end that is closer to the sample.

A segment of the multiple segments may be of any shape, for example, have a triangular cross section, have a rectangular cross section, have a non-linear cross section, and the like.

A segment of the multiple segments may include a proximal end of a first width and a distal end of a second width, the second width exceeds the first width.

The crosstalk reduction unit may include a biasing unit.

For each sensor of the multiple sensors, the biasing unit is configured apply one or more repelling electric fields to repel cross talk backscattered electrons from the sensor.

Alternatively—wherein for each sensor of the multiple sensors, the biasing unit is configured apply one or more attracting electric fields to attract relevant backscattered electrons to the sensor.

Any reference to the term "comprising" or "having" should be interpreted also as referring to "consisting" of "essentially consisting of". For example, a method that comprises certain steps can include additional steps, can be limited to the certain steps or may include additional steps that do not materially affect the basic and novel characteristics of the method-respectively.

It will, however, be evident that various modifications and changes may be made therein without departing from the broader spirit and scope of the one or more embodiments of the application as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to one or more embodiments of the application containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the one or more embodiments of the application have been illustrated and described herein, many modifications, substitutions, changes, and equivalents will now occur to those of ordinary skill in the art. It is, therefore, to be understood that the appended claims are intended to cover all such modifications and changes as fall within the true spirit of the one or more embodiments of the application.

What is claimed is:

1. Multiple electron beam optics, comprising:
a detection unit comprising an array of sensors, each sensor in the array of sensors including an aperture and a sensing region configured to sense relevant backscattered electrons emitted from a sample as a result of an illumination of the sample with a primary electron beam associated with the sensor and passed through the aperture; and
a cross talk reduction unit configured to at least partially prevent a detection, by the sensor, of cross talk backscattered electrons emitted from the sample as result of an illumination of the sample by one or more primary beams not associated with the sensor;
wherein the cross talk reduction unit comprises a biasing unit, and for each sensor of the multiple sensors, the biasing unit is configured apply one or more repelling electric fields to repel cross talk backscattered electrons from the sensor.

2. Multiple electron beam optics, comprising:
a detection unit comprising an array of sensors, each sensor in the array of sensors including an aperture and a sensing region configured to sense relevant backscattered electrons emitted from a sample as a result of an illumination of the sample with a primary electron beam associated with the sensor and passed through the aperture; and
a cross talk reduction unit comprising a spatial filter having multiple segments, the cross talk reduction unit configured to at least partially prevent a detection, by the sensor, of cross talk backscattered electrons emitted from the sample as result of an illumination of the sample by one or more primary beams not associated with the sensor;
wherein a segment of the multiple segments comprises a proximal end of a first width and a distal end of a second width, the second width exceeds the first width.

3. The multiple electron beam optics according to claim 2 wherein a segment of the multiple segments comprises a proximal end that is positioned at an inter-sensor border.

4. The multiple electron beam optics according to claim 2 wherein a segment of the multiple segments has a triangular cross section.

5. A system for multiple electron beam evaluation of a sample, the system comprising:
multiple electron beam optics; wherein the multiple electron beam optics comprise a cross talk reduction unit and a detection unit that comprises an array of sensors; and
a multiple electron beam provider that is configured to generate multiple primary beams, each primary beam is associated with a sensor of multiple sensors of the array of sensors;
wherein for each sensor of multiple sensors of the array of sensors:
the sensor comprises an aperture and a sensing region that is configured to sense relevant backscattered electrons, the relevant backscattered electrons are emitted from the sample as a result of an illumination of the sample with a primary electron beam that passed through the aperture and is associated with the sensor; and
the crosstalk reduction unit is configured to at least partially prevent a detection, by the sensor, of cross talk backscattered electrons, the cross talk backscattered electrons are emitted from the sample as result of an illumination of the sample by one or more primary beams not associated with the sensor.

6. A method for multiple electron beam evaluation of a sample, the method comprising:
passing multiple primary electron beams through apertures of multiple sensors of an array of sensors of a detection unit; wherein each sensor of the multiple sensors is associated with a primary electron beam of the multiple primary electron beams;
illuminating the sample with the multiple primary electron beams;
sensing relevant backscattered electrons by sensing regions of the multiple sensors;
wherein for each sensor of the multiple sensors, relevant backscattered electrons are emitted from the sample as a result of the illuminating of the sample with a primary electron beam that is associated with the sensor; and
reducing cross talk by a cross talk reduction unit; wherein for each sensor of the multiple sensors, the reducing of the cross talk comprises at least partially preventing a detection, by the sensor, of cross talk backscattered electrons, the cross talk backscattered electrons are emitted from the sample as result of the illuminating of the sample by one or more primary beams not associated with the sensor.

7. The method according to claim 6 wherein the crosstalk reduction unit comprises a spatial filter.

8. The multiple electron beam optics according to claim 7 wherein the spatial filter comprises multiple segments.

9. The method according to claim 8 wherein a segment of the multiple segments comprises a proximal end that is positioned at one or more inter-sensor borders.

10. The method according to claim 8 wherein a segment of the multiple segments has a triangular cross section.

11. The method according to claim 8 wherein a segment of the multiple segments comprises a proximal end of a first width and a distal end of a second width, the second width exceeds the first width.

12. The method according to claim 6 wherein the cross-talk reduction unit comprises a biasing unit.

13. The method according to claim 12 wherein for each sensor of the multiple sensors, the biasing unit is configured apply one or more repelling electric fields to repel cross talk backscattered electrons from the sensor.

14. The method according to claim 12 wherein for each sensor of the multiple sensors, the biasing unit is configured apply one or more attracting electric fields to attract relevant backscattered electrons to the sensor.

* * * * *